(12) United States Patent
Chen et al.

(10) Patent No.: US 8,779,436 B2
(45) Date of Patent: Jul. 15, 2014

(54) DISPLAY PANEL

(71) Applicant: AU Optronics Corp., Hsin-Chu (TW)

(72) Inventors: Yi-Ching Chen, Hsin-Chu (TW);
Yu-Sheng Huang, Hsin-Chu (TW);
Chia-Wei Chen, Hsin-Chu (TW);
Chun-Ru Huang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/802,650

(22) Filed: Mar. 13, 2013

(65) Prior Publication Data
US 2014/0054624 A1 Feb. 27, 2014

(30) Foreign Application Priority Data

Aug. 27, 2012 (TW) .............. 101130994 A

(51) Int. Cl.
H01L 27/14 (2006.01)
H01L 27/15 (2006.01)
(52) U.S. Cl.
CPC .................... H01L 27/156 (2013.01)
USPC ............................. 257/72; 257/59

(58) Field of Classification Search
USPC ....................................... 257/72, 59
See application file for complete search history.

(56) References Cited

U.S. PATENT DOCUMENTS

| 2006/0139281 | A1* | 6/2006 | Park ................................. 345/96 |
| 2007/0097072 | A1* | 5/2007 | Kim et al. .................... 345/103 |
| 2008/0079678 | A1* | 4/2008 | Cho et al. ........................ 345/88 |
| 2008/0266225 | A1* | 10/2008 | Kim ................................. 345/88 |
| 2009/0262054 | A1* | 10/2009 | Hsu et al. ........................ 345/87 |
| 2010/0156954 | A1* | 6/2010 | Kim et al. ..................... 345/690 |
| 2010/0245333 | A1 | 9/2010 | Hsu |
| 2010/0245698 | A1 | 9/2010 | Kim |
| 2011/0032457 | A1 | 2/2011 | Kwak |
| 2011/0249037 | A1 | 10/2011 | Koyama |
| 2013/0215090 | A1* | 8/2013 | Kim et al. ..................... 345/204 |
| 2013/0265514 | A1* | 10/2013 | Li et al. ........................... 349/41 |
| 2013/0314618 | A1* | 11/2013 | Yamakawa .................... 348/790 |

* cited by examiner

Primary Examiner — Bilkis Jahan
(74) Attorney, Agent, or Firm — Winston Hsu; Scott Margo

(57) ABSTRACT

A display device includes a plurality of pixel units. Each of the pixel units at least includes three sub-pixels for displaying different colors. The three sub-pixels are electrically connected to three different gate lines, and at least two of the three sub-pixels are electrically connected to the same data line.

12 Claims, 9 Drawing Sheets

DISPLAY PANEL

BACKGROUND OF THE DISCLOSURE

1. Technical Field

This disclosure relates to a display panel, and more particularly, to a display panel able to reduce the number of source driving chips and address color washout problem.

2. Description of the Related Art

With the prevalence of flat TV, smart phone and tablet PC, various types of display panels such as liquid crystal display (LCD) panels and organic electroluminescent display panels advance unceasingly in specification and size to meet market requirements. The development of display panel, however, faces many deficiencies to be solved. For example, as the resolution of display panel increases, the number of source driving chips increases as well, and thus the fabrication costs of display panel is increased and a slim border design is impeded. In addition, the conventional LCD panel is inherently suffered from color washout problem, which requires to be addressed.

SUMMARY OF THE DISCLOSURE

It is therefore one of the objectives of the disclosure to provide a display panel in order to reduce cost and solve color washout problem.

According to an embodiment of this disclosure, a display panel is provided. The display panel includes a first pixel unit and a second pixel unit, sequentially arranged in a first column. The first pixel unit at least includes a first sub-pixel, a second sub-pixel and a third sub-pixel configured to display different colors, respectively. The first sub-pixel of the first pixel unit is electrically connected to a third gate line and a first data line, the second sub-pixel of the first pixel unit is electrically connected to a second gate line and the first data line, and the third sub-pixel of the first pixel unit is electrically connected to a first gate line. The second pixel unit at least includes a fourth sub-pixel, a fifth sub-pixel and a sixth sub-pixel configured to display different colors, respectively. The fourth sub-pixel of the second pixel unit is electrically connected to a fourth gate line, the fifth sub-pixel of the second pixel unit is electrically connected to a fifth gate line and a second data line, and the sixth sub-pixel of the second pixel unit is electrically connected to a sixth gate line and the second data line. The first data line and the second data line, which are arranged sequentially, intersect the first gate line, the second gate line, the third gate line, the fourth gate line, the fifth gate line and the sixth gate line, which are arranged sequentially, thereby constituting the first pixel unit and the second pixel unit.

According to another embodiment of this disclosure, a display panel is provided. The display panel includes a first pixel unit and a second pixel unit, sequentially arranged in a first column. The first pixel unit at least includes a first sub-pixel, a second sub-pixel and a third sub-pixel configured to display different colors, respectively. The first sub-pixel of the first pixel unit is electrically connected to a first gate line and a second data line, the second sub-pixel of the first pixel unit is electrically connected to a third gate line and the second data line, and the third sub-pixel of the first pixel unit is electrically connected to a second gate line and the second data line. The second pixel unit at least includes a fourth sub-pixel, a fifth sub-pixel and a sixth sub-pixel configured to display different colors, respectively. The fourth sub-pixel of the second pixel unit is electrically connected to a fourth gate line and a first data line, the fifth sub-pixel of the second pixel unit is electrically connected to a fifth gate line and a third data line, and the sixth sub-pixel of the second pixel unit is electrically connected to a sixth gate line and the third data line. The first data line, the second data line and the third data line, which are arranged sequentially, intersect the first gate line, the second gate line, the third gate line, the fourth gate line, the fifth gate line and the sixth gate line, which are arranged sequentially, thereby constituting the first pixel unit and the second pixel unit.

According to still another embodiment of this disclosure, a display panel is provided. The display panel includes a first pixel unit and a second pixel unit, sequentially arranged in a first column. The first pixel unit at least includes a first sub-pixel, a second sub-pixel and a third sub-pixel configured to display different colors, respectively. The first sub-pixel of the first pixel unit is electrically connected to a second gate line and a second data line, the second sub-pixel of the first pixel unit is electrically connected to a third gate line and the second data line, and the third sub-pixel of the first pixel unit is electrically connected to a first gate line and the second data line. The second pixel unit at least includes a fourth sub-pixel, a fifth sub-pixel and a sixth sub-pixel configured to display different colors, respectively. The fourth sub-pixel of the second pixel unit is electrically connected to a fifth gate line and a first data line, the fifth sub-pixel of the second pixel unit is electrically connected to a fourth gate line and a third data line, and the sixth sub-pixel of the second pixel unit is electrically connected to a sixth gate line and the third data line. The first data line, the second data line and the third data line, which are arranged sequentially, intersect the first gate line, the second gate line, the third gate line, the fourth gate line, the fifth gate line and the sixth gate line, which are arranged sequentially, thereby constituting the first pixel unit and the second pixel unit.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
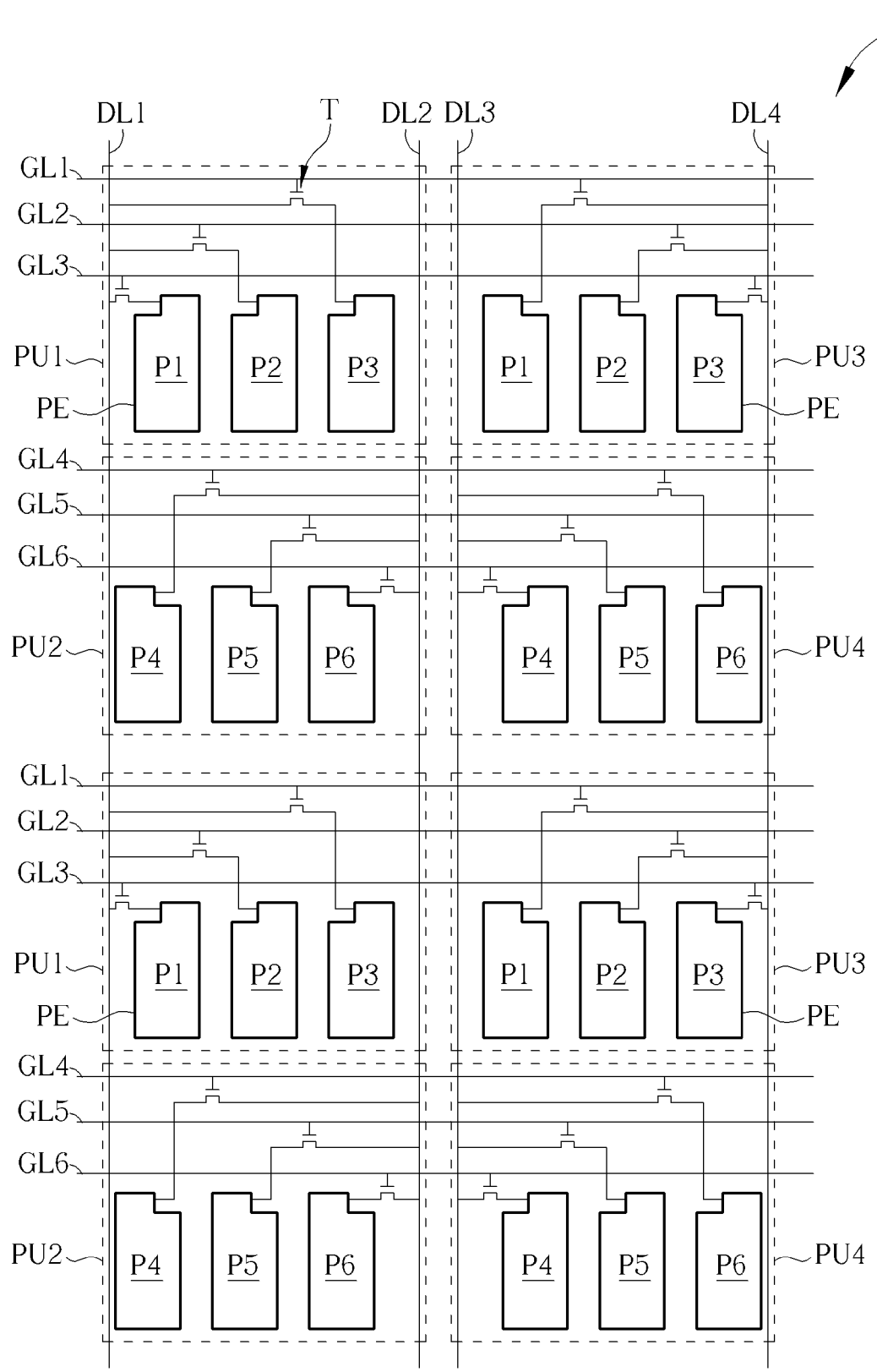
FIG. 1 is a schematic diagram illustrating a display panel of a first embodiment of this disclosure.

Referring to FIG. 1, FIG. 1 is a schematic diagram illustrating a display panel of a first embodiment of this disclosure. As shown in FIG. 1, a Non-self-luminescent display panel is taken as an example of a display panel 1 of this disclosure, but the display panel 1 is not limited thereto. The display panel 1 may be other types of display panel such as self-luminescent display panel or a hybrid display panel with both self-luminescent display medium and non-self-luminescent display medium. The non-self-luminescent display medium of non-self-luminescent display panel may include positive type liquid crystal material, negative type liquid crystal material, blue phase liquid crystal material, electrowetting material, electrophoretic material, other suitable materials or combination of at least two of the aforementioned materials. The self-luminescent display medium of self-luminescent display panel may include small molecule organic light-emitting material, polymer organic light-emitting material, inorganic light-emitting material, other suitable materials or combination of at least two of the aforementioned materials. In this embodiment, a liquid crystal display (LCD) panel using liquid crystal material as non-self-luminescent medium is selected as an example, but not limited thereto. The display panel 1 includes a plurality of gate lines (also referred to as scan lines) and a plurality of data lines. The gate lines includes, for example, a first gate line GL1, a second gate line GL2, a third gate line GL3, a fourth gate line GL4, a fifth gate line GL5 and a sixth gate line GL6, substantially extending along a row direction (latitudinal direction in FIG. 1 or horizontal direction in FIG. 1), and substantially arranged sequentially along a column direction (longitudinal direction in FIG. 1, or vertical direction in FIG. 1), but not limited thereto. In this disclosure, the longitudinal direction is defined as the column direction, and the latitudinal direction is defined as the row direction. The data lines includes, for example, a first data line DL1, a second data line DL2, a third data line DL3 and a fourth data line DL4 substantially extending along the column direction, and substantially arranged sequentially along the row direction, but not limited thereto. The third data line DL3 is most adjacent to the second data line DL2, and the first data line DL1 and the fourth data line DL4 are distant from the third data line DL3 and the second data line DL2. In other words, the distance between second data line DL2 and the third data line DL3 is less than the distance between the first data line DL1 and the second data line DL2 and the distance between the third data line DL3 and the fourth data line DL4. The display panel 1 includes a pixel array formed by sub-pixels of a plurality of columns and a plurality of rows (or namely product of sub-pixels of a plurality of columns and sub-pixels of a plurality of rows). The pixel array includes a first pixel unit PU1, a second pixel unit PU2, a third pixel unit PU3 and a fourth pixel unit PU4. The first pixel unit PU1 and the second pixel unit PU2 are sequentially arranged in an odd column e.g. a first column of the pixel array, the third pixel unit PU3 and the fourth pixel unit PU4 are sequentially arranged in an even column e.g. a second column of the pixel array, the first pixel unit PU1 and the third pixel unit PU3 are sequentially arranged in an odd row e.g. a first row of the pixel array, and the second pixel unit PU2 and the fourth pixel unit PU4 are sequentially arranged in an even row e.g. a second row of the pixel array. The first column and the second column are different columns, and the first row and the second row are different rows. Specifically, the first data line DL1 and the second data line DL2 which are arranged sequentially and the first gate line GL1, the second gate line GL2, the third gate line GL3, the fourth gate line GL4, the fifth gate line GL5 and the sixth gate line GL6 which are arranged sequentially are intersected (whether vertically intersected or non-vertically intersected), and therefore constitute the first pixel unit PU1 and the second pixel unit PU2. In addition, the third data line DL3 and the fourth data line DL4 which are arranged sequentially and the first gate line GL1, the second gate line GL2, the third gate line GL3, the fourth gate line GL4, the fifth gate line GL5 and the sixth gate line GL6 which are arranged sequentially are intersected (whether vertically intersected or non-vertically intersected), and therefore constitute the third pixel unit PU3 and the fourth pixel unit PU4.

Each first pixel unit PU1 at least includes a first sub-pixel P1, a second sub-pixel P2 and a third sub-pixel P3 configured to display different colors, respectively. The first sub-pixel P1 of the first pixel unit PU1 is electrically connected to the third gate line GL3 and the first data line DL1, the second sub-pixel P2 of the first pixel unit PU1 is electrically connected to the second gate line GL2 and the first data line DL1, and the third sub-pixel P3 of the first pixel unit PU1 is electrically connected to the first gate line GL1 and the first data line DL1. Each second pixel unit PU2 at least includes a fourth sub-pixel P4, a fifth sub-pixel P5 and a sixth sub-pixel P6 configured to display different colors, respectively. The fourth sub-pixel P4 of the second pixel unit PU2 is electrically connected to the fourth gate line GL4 and the second data line DL2, the fifth sub-pixel P5 of the second pixel unit PU2 is electrically connected to the fifth gate line GL5 and the second data line DL2, and the sixth sub-pixel P6 of the second pixel unit PU2 is electrically connected to the sixth gate line GL6 and the second data line DL2. Each third pixel unit PU3 at least includes a first sub-pixel P1, a second sub-pixel P2 and a third sub-pixel P3 configured to display different colors, respectively. The first sub-pixel P1 of the third pixel unit PU3 is electrically connected to the first gate line GL1 and the fourth data line DL4, the second sub-pixel P2 of the third pixel unit PU3 is electrically connected to the second gate line GL2 and the fourth data line DL4, and the third sub-pixel P3 of the third pixel unit PU3 is electrically connected to the third gate line GL3 and the fourth data line DL4. Each fourth pixel unit PU4 at least includes a fourth sub-pixel P4, a fifth sub-pixel P5 and a sixth sub-pixel P6 configured to display different colors, respectively. The fourth sub-pixel P4 of the fourth pixel unit PU4 is electrically connected to the sixth gate line GL6 and the third data line DL3, the fifth sub-pixel P5 of the fourth pixel unit PU4 is electrically connected to the fifth gate line GL5 and the third data line DL3, and the sixth sub-pixel P6 of the fourth pixel unit PU4 is electrically connected to the fourth gate line GL4 and the third data line DL3.

In this embodiment, the arrangement of the first sub-pixel P1, the second sub-pixel P2 and the third sub-pixel P3 is not limited. As shown in FIG. 1, the first sub-pixel P1, the second sub-pixel P2 and the third sub-pixel P3 are exemplarily arranged along the row direction, and the first sub-pixel P1, the second sub-pixel P2 and the third sub-pixel P3 are preferably arranged from left to right along the row direction, but not limited. In other embodiments, the arrangement of the first sub-pixel P1, the second sub-pixel P2 and the third sub-pixel P3 may includes the following configurations for example. 1. The first sub-pixel P1 and the second sub-pixel P2 are arranged from left to right in one row, and the third sub-pixel P3 is arranged in another row; 2. The first sub-pixel P1 and the second sub-pixel P2 are arranged from left to right in the same row, and the third sub-pixel P3 is arranged between the first sub-pixel P1 and the second sub-pixel P2; 3. The second sub-pixel P2 and the third sub-pixel P3 are arranged from left to right in the same row, and the first sub-pixel P1 is arranged between the second sub-pixel P2 and the third sub-pixel P3; 4. The first sub-pixel P1 and the second sub-pixel P2 are arranged from left to right in the same row, and the third sub-pixel P3 is arranged inside the first sub-pixel P1 and the second sub-pixel P2; 5. The second sub-pixel P2 and the third sub-pixel P3 are arranged from left to right in the same row, and the first sub-pixel P1 is arranged inside the second sub-pixel P2 and the third sub-pixel P3; 6. The first sub-pixel P1 and the third sub-pixel P3 are arranged from left to right in the same row, and the second sub-pixel P2 is arranged between the first sub-pixel P1 and the third sub-pixel P3; 7. The first sub-pixel P1, the second sub-pixel P2 and the third sub-pixel P3 are arranged from top to bottom in the same column; 8. An arrangement selected from arrangements 1-6, where the row direction is switched to the column direction. In this embodiment, the arrangement of the fourth sub-pixel P4, the fifth sub-pixel P5 and the sixth sub-pixel P6 is not limited. As shown in FIG. 1, the fourth sub-pixel P4, the fifth sub-pixel P5 and the sixth sub-pixel P6 are exemplarily arranged along the row direction, and the fourth sub-pixel P4, the fifth sub-pixel P5 and the sixth sub-pixel P6 are preferably arranged from left to right along the row direction, but not limited thereto. In other embodiments, the arrangement of the fourth sub-pixel P4, the fifth sub-pixel P5 and the sixth sub-pixel P6 may be similar to any one of the aforementioned arrangement of the first sub-pixel P1, the second sub-pixel P2 and the third sub-pixel P3. In addition, in the column direction, the first sub-pixel P1, the second sub-pixel P2 and the third sub-pixel P3 are preferably arranged corresponding to the fourth sub-pixel P4, the fifth sub-pixel P5 and the sixth sub-pixel P6. Also, the sub-pixels disposed in the same column are used to display substantially the same color. For example, the first sub-pixel P1 and the fourth sub-pixel P4 are used to display substantially the same color e.g. red color, the second sub-pixel P2 and the fifth sub-pixel P5 are used to display substantially the same color e.g. green color, the third sub-pixel P3 and the sixth sub-pixel P6 are used to display substantially the same color e.g. blue color, but not limited thereto. In other embodiments, the above sub-pixels can display predetermined colors, and the above sub-pixels are not necessary to be disposed in the same column. The predetermined colors are not limited to be red, green and blue, and may be any colors selected from CIE color coordinate system. In addition, the above pixel unit is composed of three sub-pixels, but not limited. For example, in other embodiments, the pixel unit may be composed of four sub-pixels, five sub-pixels, six sub-pixels or more sub-pixels, and the sub-pixels other than the above three sub-pixels may be designed and arranged similar to the above three sub-pixels. Moreover, the colors of the sub-pixels other than the colors of the above three sub-pixels may be selected from any colors of the color coordinate system e.g. white, yellow, red, green, blue, a combination of any two or more colors of the color coordinate system, or any suitable color. Each sub-pixel may includes at least one switching device e.g. a thin film transistor (TFT) device T and at least one pixel electrode PE, wherein the gate electrode, source electrode and drain electrode of each TFT device T is electrically connected to a corresponding gate line, data line and pixel electrode PE. The TFT device T may include a top gate type TFT device or a bottom gate type TFT device. The material of the semiconductor in the TFT device T may include amorphous semiconductor, polycrystalline semiconductor, microcrystalline semiconductor, single-crystalline semiconductor, nanocrystalline semiconductor, organic semiconductor, metal oxide semiconductor, other suitable material or combination thereof. In addition, the display panel 1 is essentially formed by two substrates and a display medium layer disposed between two substrates. Based on the material of the display medium layer disposed between the substrates, the display panel 1 may be a non-self-luminescent display panel, a self-luminescent display panel or a hybrid display panel. The display medium of a non-self-luminescent display panel includes liquid crystal material (e.g. positive type liquid crystal material, negative type liquid crystal material or other suitable liquid crystal materials), electrowetting material, electrophoretic material, other suitable material or combination thereof. The display medium of a self-luminescent display panel includes organic light-emitting material (e.g. small molecule, large molecule or other suitable material), inorganic light-emitting material, other suitable materials or combination thereof. The display medium of a hybrid display panel includes both self-luminescent light-emitting material and non-self-luminescent light-emitting material. In this embodiment, a non-self-luminescent display panel, which includes non-self-luminescent display medium e.g. liquid crystal material, is used as an example to illustrate the display panel, but not limited thereto.

The display panel 1 may further include at least one storage capacitor, and at least another device such as a common line (also referred to as a storage capacitor line), a common electrode, a liquid crystal capacitor, a power line, a select line or other suitable device based on different types of the display panel. The function and arrangement of the above devices are well known to those skilled in the art, and thus are not redundantly described.

The display panel 1 of this embodiment is a tri-gate type display panel. Specifically, if the resolution of the display panel 1 is n*m (or namely product of n and m), the number of data lines is m, and the number of gate lines is 3*n. Compared with a single-gate type display panel, the display panel 1 of this embodiment includes more gate lines but less data lines. In such case, the number of source driving chips with higher fabrication cost and higher power consumption is reduced. In addition, since the number of data lines is reduced, the area for accommodating connection wirings of the data lines can be reduced, which makes it possible to implement slim border design.

Figure 2:
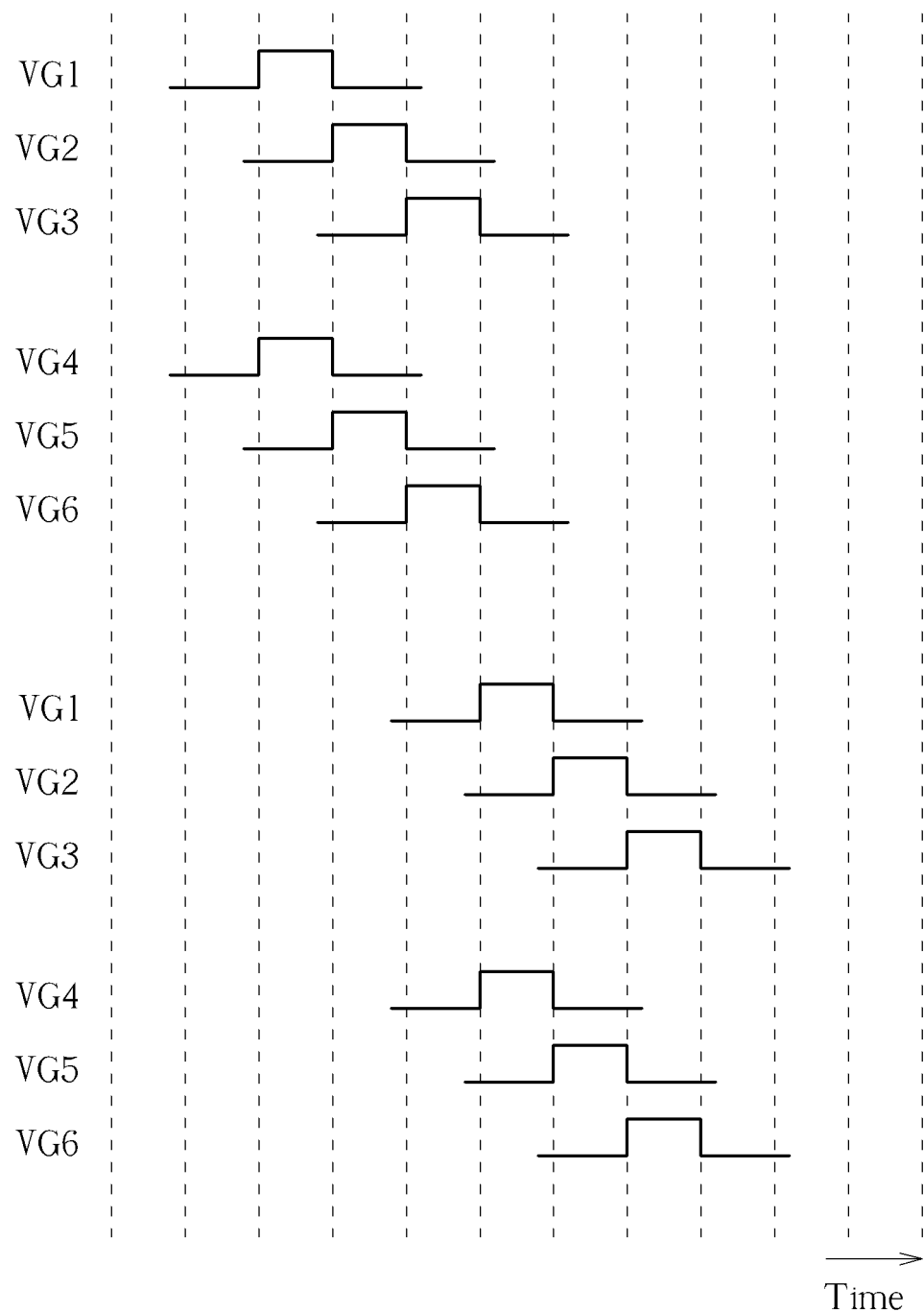
FIG. 2 is a timing diagram of the display panel of FIG. 1.

Referring to FIG. 2 as well as FIG. 1, FIG. 2 is a timing diagram of the display panel of FIG. 1. As shown in FIG. 2, when the display panel 1 is driven, the first gate line GL1, the second gate line GL2, the third gate line GL3, the fourth gate line GL4, the fifth gate line GL5 and the sixth gate line GL6 have a first gate signal VG1, a second gate signal VG2, a third gate signal VG3, a fourth gate signal VG4, a fifth gate signal VG5 and a sixth gate signal VG6, respectively. The timing of the second gate signal VG2 is behind the timing of the first gate signal VG1, and preferably the timing of the second gate signal VG2 and the timing of the first gate signal VG1 do not overlap. The timing of the third gate signal VG3 is behind the timing of the second gate signal VG2, and preferably the timing of the third gate signal VG3 and the timing of the second gate signal VG2 do not overlap. In addition, the timing of the first gate signal VG1 and the timing of the fourth gate signal VG4 are substantially equal, the timing of the second gate signal VG2 and the timing of the fifth gate signal VG5 are substantially equal, and the timing of the third gate signal VG3 and the timing of the sixe gate signal VG6 are substantially equal. Consequently, the charging time of the display panel 1 of this embodiment may be prolonged, thereby supporting about 120 Hz frame rate without influencing display quality.

The display panel is not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 3:
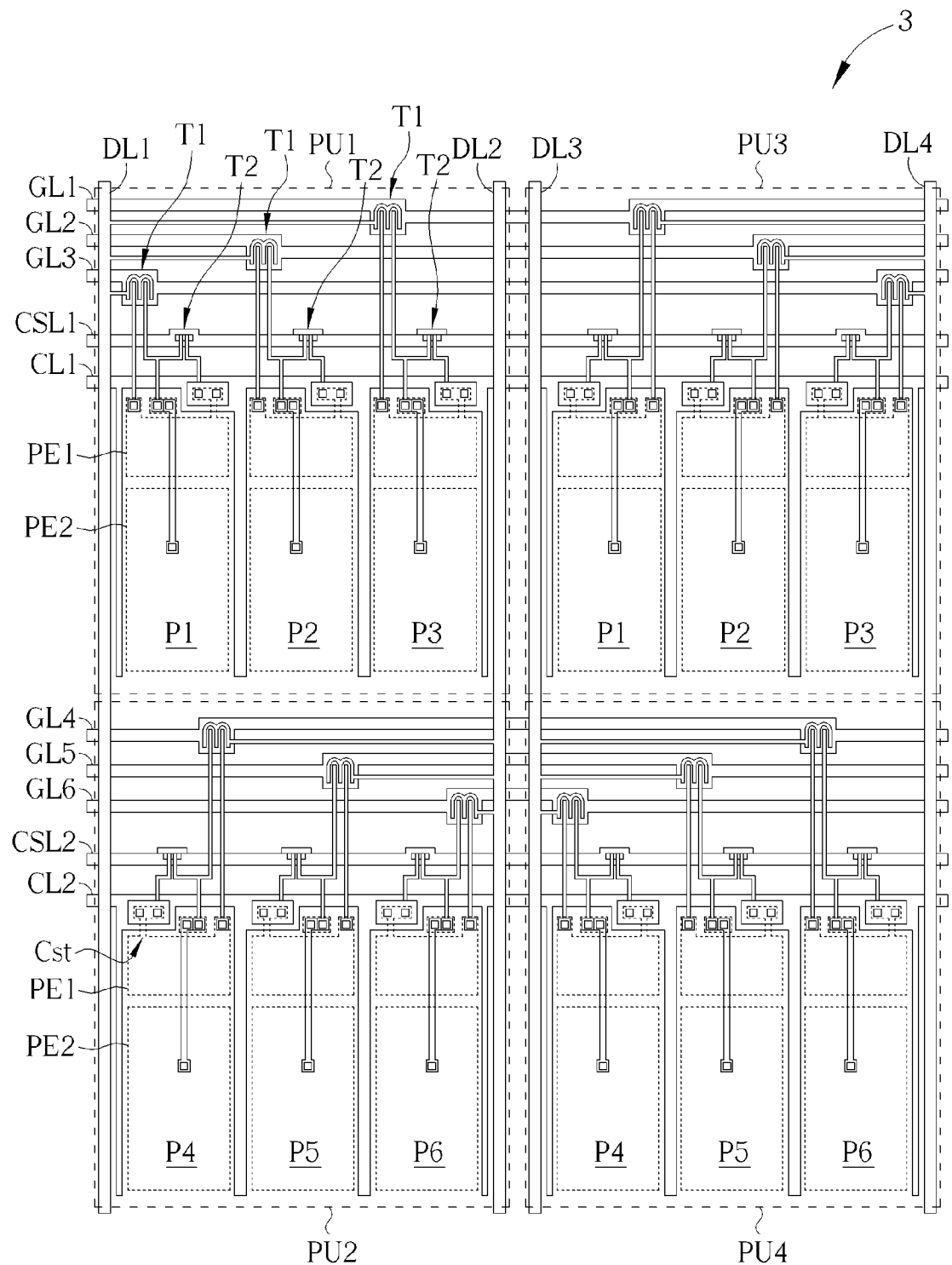
FIG. 3 is a schematic diagram illustrating a display panel according to a variant embodiment of the first embodiment.

Referring to FIG. 3, FIG. 3 is a schematic diagram illustrating a display panel according to a variant embodiment of the first embodiment. As shown in FIG. 3, different from the first embodiment, in the display panel 3 of this variant embodiment, the first sub-pixel P1, the second sub-pixel P2, the third sub-pixel P3, the fourth sub-pixel P4, the fifth sub-pixel P5 and the sixth sub-pixel P6 each include a first pixel electrode PE1 and a second pixel electrode PE2. The display panel 3 further includes a first common line CL1 and a second common line CL2. The first common line CL1 may be disposed between the third gate line GL3 and the fourth gate line GL4, and the second common line CL2 may be disposed on one side of the sixth gate line GL6 opposite to the fifth gate line GL5 (or namely the second common line CL2 may be disposed between the sixth gate line GL6 in second pixel unit PU2 of second row and the first gate line GL1 in first pixel unit PU1 of third row (not shown in FIG. 3)). The first common line CL1 and the second common line CL2 may be selectively electrically connected, and share a common signal. The first pixel electrodes PE1 of the first sub-pixel P1, the second sub-pixel P2 and the third sub-pixel P3 form a storage capacitor Cst with the first common line CL1, respectively, and the first pixel electrodes PE1 of the fourth sub-pixel P, the fifth sub-pixel P5 and the sixth sub-pixel P6 form a storage capacitor Cst with the second common line CL2, respectively. The display panel 3 further includes a first charge sharing line CSL1 and a second charge sharing line CSL2. The first charge sharing line CSL1 and the second charge sharing line CSL2 are substantially extending along the row direction, and arranged sequentially along the column direction. The first charge sharing line CSL1 may be disposed between the third gate line GL3 and the fourth gate line GL4, and the second charge sharing line CSL2 may be disposed on one side of the sixth gate line GL6 opposite to the fifth gate line GL5 (or namely the second charge sharing line CSL2 may be disposed between the sixth gate line GL6 in second pixel unit PU2 of second row and the first gate line GL1 in first pixel unit PU1 of third row (not shown in FIG. 3)). Specifically, the first charge sharing line CSL1 may be disposed between the third gate line GL3 and the first common line CL1, the second charge sharing line CSL2 may be disposed between the sixth gate line GL6 and the second common line CL2, but not limited thereto.

In this variant embodiment, each sub-pixel includes a first TFT device T1 and a second TFT device T2. The gate electrode, source electrode and drain electrode of the first TFT device T1 is electrically connected to a corresponding gate line, data line and first pixel electrode PE1, respectively. The gate electrode of the second TFT device T2 is electrically connected to a corresponding first charge sharing line CLS1 or a corresponding second charge sharing line CSL2, the source electrode of the second TFT device T2 is electrically connected to a corresponding second pixel electrode PE2 as well as the drain electrode of a corresponding first TFT device T1, and the drain electrode of the second TFT device T2 is electrically connected to a electrode (for example, a first pixel electrode PE1) of a corresponding storage capacitor Cst. It is noted that in FIG. 3, the first TFT device T1, the second TFT device T2, the first pixel electrode PE1 and the second pixel electrode PE2 of the first pixel unit PU1 are denoted. The aforementioned devices of other pixel units including the second pixel unit PU2, the third pixel unit PU3 and the fourth pixel unit PU4, though not denoted, are arranged by similar approach. Specifically, the TFT devices that are electrically connected to the gate line are the first TFT devices T1, the TFT devices that are electrically connected to the first charge sharing line CSL1 or the second charge sharing line CSL2 are the second TFT devices T2. The first pixel electrode PE1 and the second pixel electrode PE2 are electrically connected to the first TFT device T1 or the second TFT device T2 as previously described. The first charge sharing line CSL1 is used to perform charge sharing on the second electrodes PE2 in the first sub-pixel P1, the second sub-pixel P2 and the third sub-pixel P3, and the second charge sharing line CSL2 is used to perform charge sharing on the second electrodes PE2 in the fourth sub-pixel P4, the fifth sub-pixel P5 and the sixth sub-pixel P6. That is to say, when the firth TFT device T1 is turned on, the pixel voltage delivered by the data line will be transmitted to the first pixel electrode PE1. The pixel voltage delivered by the data line will also be transmitted to the second TFT device T2, and the first charge sharing line CSL1 or the second charge sharing line CSL2 thus can turn on a corresponding second TFT device T2, and perform charge sharing on all of the sub-pixels of the corresponding second TFT device T2 such that the pixel voltage transmitted to the second pixel electrode PE2 is substantially different from the pixel voltage transmitted to the first pixel electrode PE1. Therefore, each sub-pixel includes a main region and a sub region of different brightness, thereby achieving multiple alignment domain effect and solving color washout problem.

Figure 4:
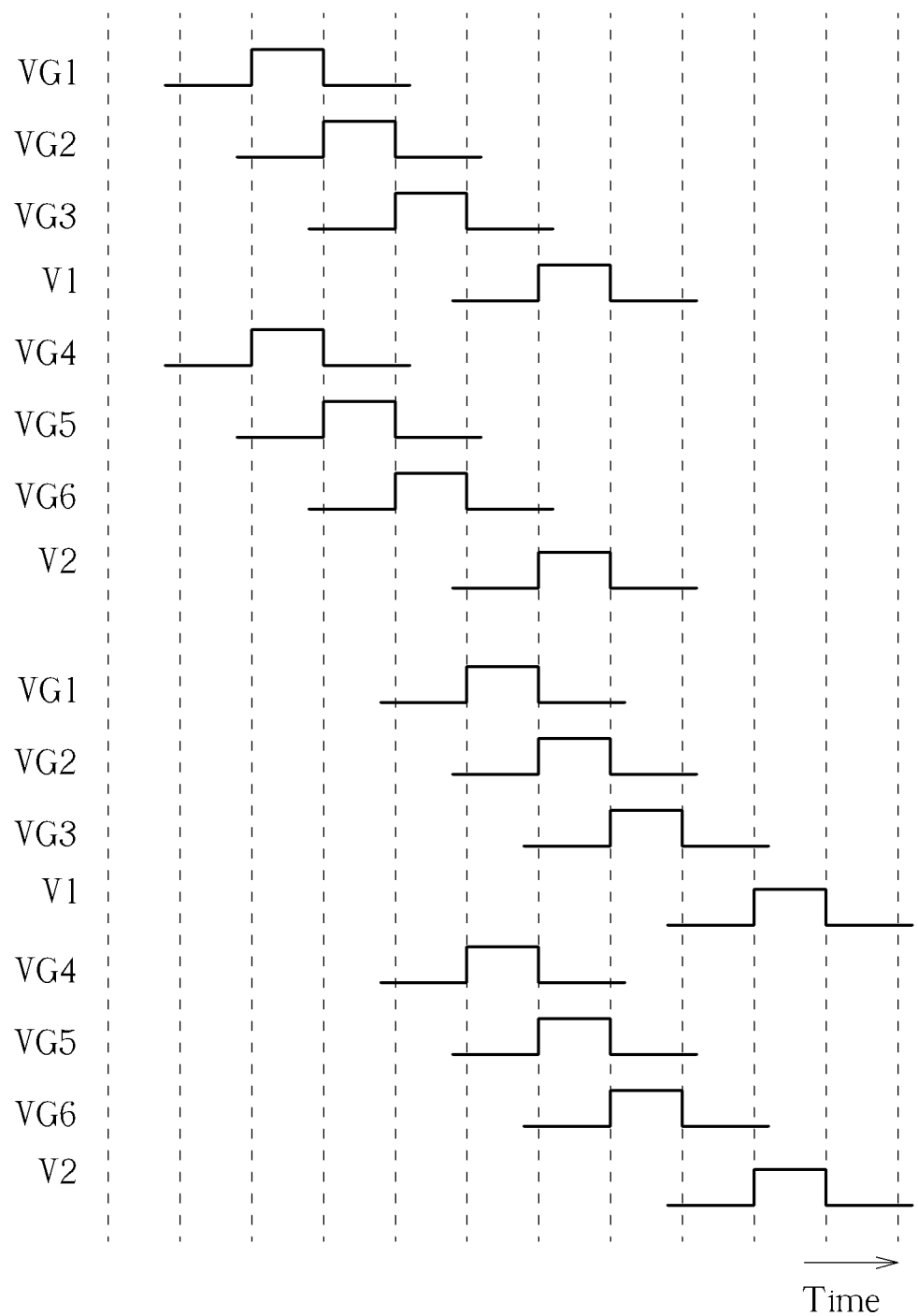
FIG. 4 is a timing diagram of the display panel of FIG. 3 in a non-precharge driving approach.

Referring to FIG. 4 as well as FIG. 3, FIG. 4 is a timing diagram of the display panel of FIG. 3 in a non-precharge driving approach. As shown in FIG. 4, in a non-precharge driving approach, the first gate line GL1, the second gate line GL2, the third gate line GL3, the fourth gate line GL4, the fifth gate line GL5 and the sixth gate line GL6 have a first gate signal VG1, a second gate signal VG2, a third gate signal VG3, a fourth gate signal VG4, a fifth gate signal VG5 and a sixth gate signal VG6, respectively. The timing of the second gate signal VG2 is behind the timing of the first gate signal VG1, and the timing of the second gate signal VG2 and the timing of the first gate signal VG1 do not overlap. The timing of the third gate signal VG3 is behind the timing of the second gate signal VG2, and preferably the timing of the third gate signal VG3 and the timing of the second gate signal VG2 do not overlap. In addition, the timing of the first gate signal VG1 and the timing of the fourth gate signal VG4 are substantially equal, the timing of the second gate signal VG2 and the timing of the fifth gate signal VG5 are substantially equal, and the timing of the third gate signal VG3 and the timing of the sixe gate signal VG6 are substantially equal. In addition, the first charge sharing line CSL1 and the second charge sharing line CSL2 have a first signal V1 and a second signal V2, respectively. The first signal V1 and the second signal V2 are substantially synchronized, and the first signal V1 and the second signal V2 are behind and do not overlap the third gate signal VG3 and the sixth gate signal VG6.

Figure 5:
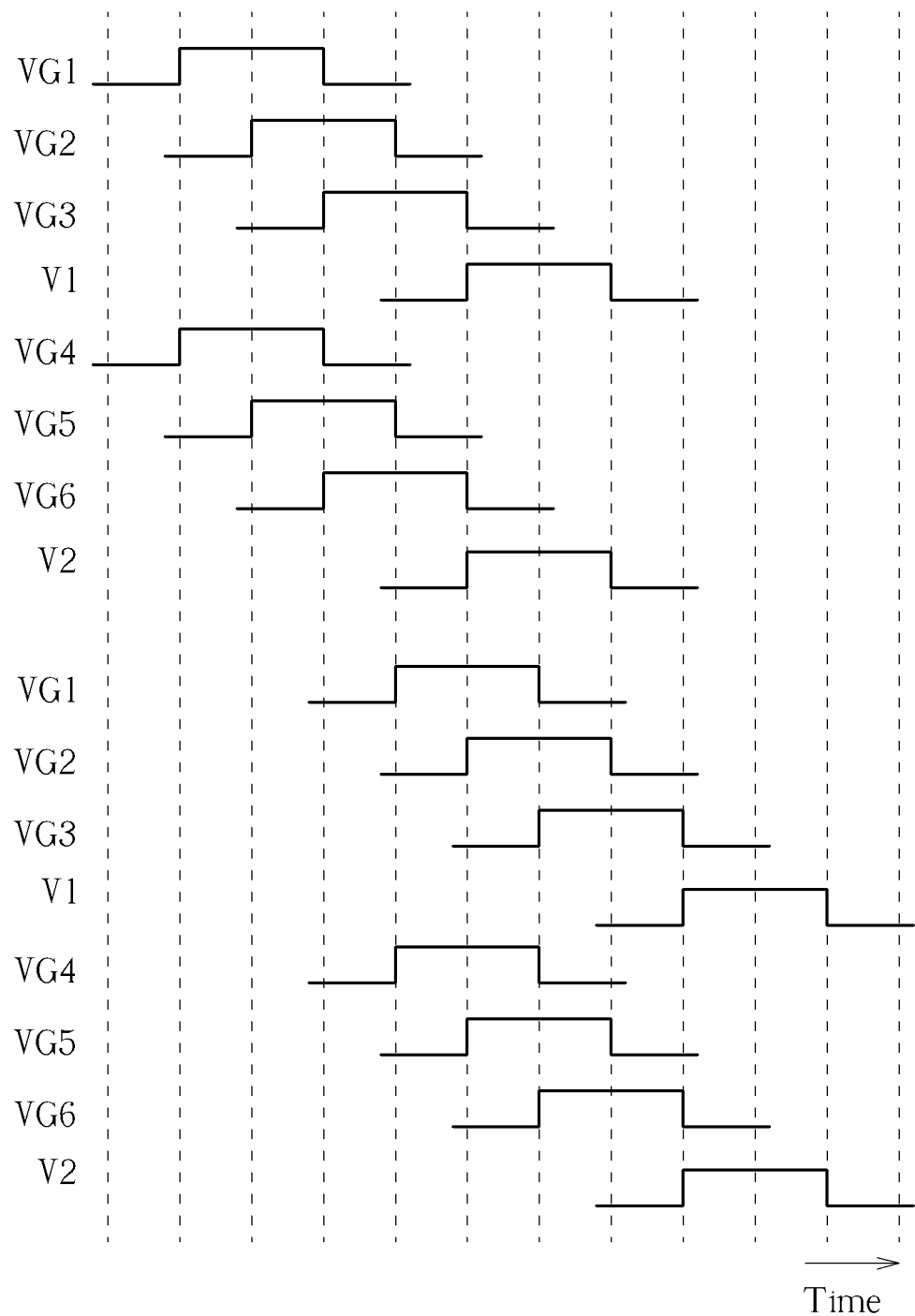
FIG. 5 is a timing diagram of the display panel of FIG. 3 in a precharge driving approach.

Referring to FIG. 5 as well as FIG. 3, FIG. 5 is a timing diagram of the display panel of FIG. 3 in a precharge driving approach. As shown in FIG. 4, in a precharge driving approach. The timing of the second gate signal VG2 is behind the timing of the first gate signal VG1, and the timing of the second gate signal VG2 and the timing of the first gate signal VG1 partial overlap. The timing of the third gate signal VG3 is behind the timing of the second gate signal VG2, and the timing of the third gate signal VG3 and the timing of the second gate signal VG2 partial overlap. In addition, the timing of the first gate signal VG1 and the timing of the fourth gate signal VG4 are substantially equal, the timing of the second gate signal VG2 and the timing of the fifth gate signal VG5 are substantially equal, and the timing of the third gate signal VG3 and the timing of the sixe gate signal VG6 are substantially equal. In addition, the first signal V1 and the second signal V2 are substantially synchronized, and the first signal V1 and the second signal V2 are behind and do not overlap the third gate signal VG3 and the sixth gate signal VG6.

Figure 6:
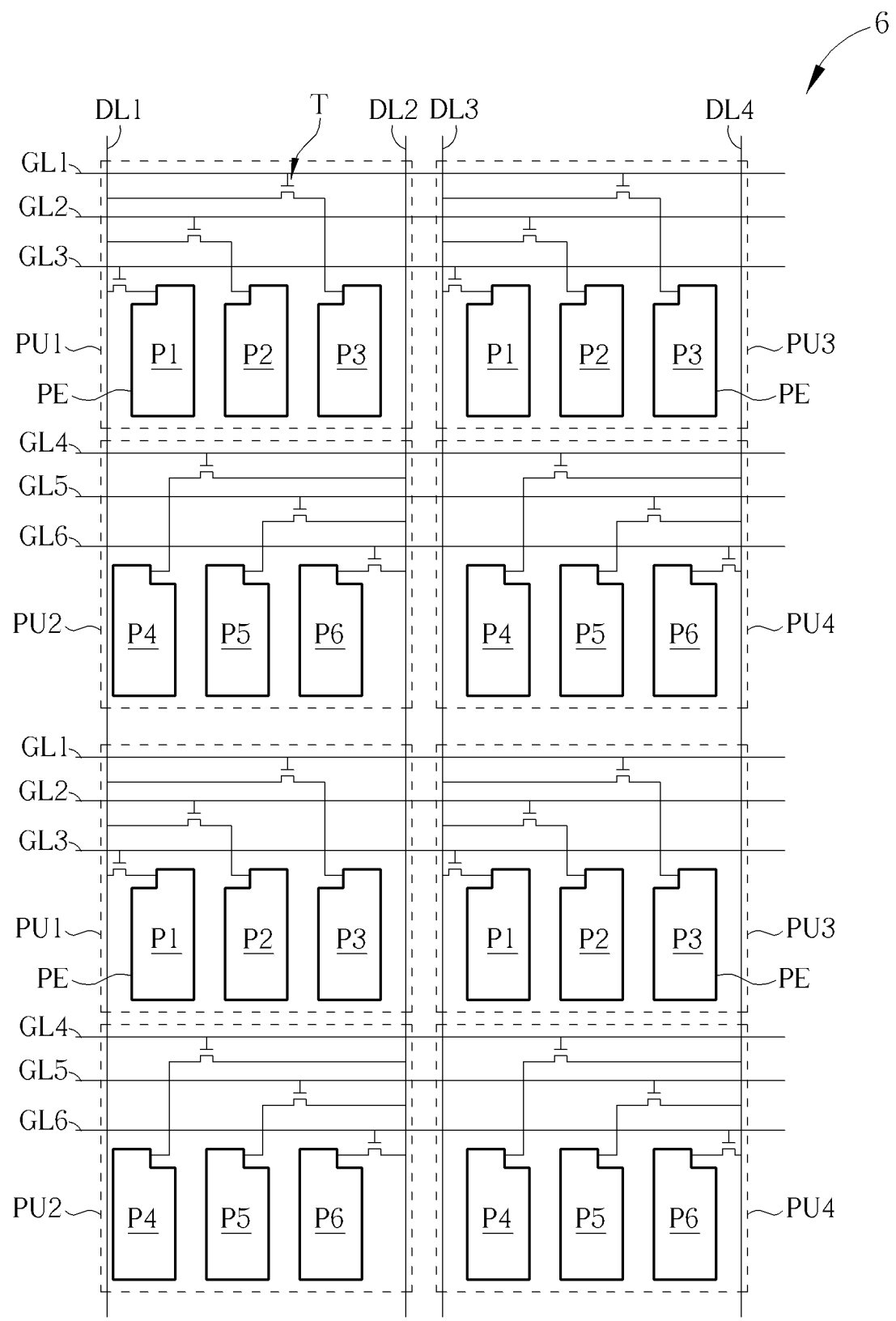
FIG. 6 is a schematic diagram illustrating a display panel according to a second embodiment of this disclosure.

Referring to FIG. 6, FIG. 6 is a schematic diagram illustrating a display panel according to a second embodiment of this disclosure. As shown in FIG. 6, in the display panel 6 of this embodiment, the location of the first pixel unit PU1, the second pixel unit PU2, the third pixel unit PU3 and the fourth pixel unit PU4 and the arrangement of the first pixel unit PU1 and the second pixel unit PU2 are identical to the first embodiment, but the arrangement of the third pixel unit PU3 and the fourth pixel unit PU4 of the display panel 6 is different from the first embodiment. In this embodiment, the first sub-pixel P1 of the third pixel unit PU3 is electrically connected to the third gate line GL3 and the third data line DL3, the second sub-pixel P2 of the third pixel unit PU3 is electrically connected to the second gate line GL2 and the third data line DL3, and the third sub-pixel P3 of the third pixel unit PU3 is electrically connected to the first gate line GL1 and the third data line DL3; and the fourth sub-pixel P4 of the fourth pixel unit PU4 is electrically connected to the fourth gate line GL4 and the fourth data line DL4, the fifth sub-pixel P5 of the fourth pixel unit PU4 is electrically connected to the fifth gate line GL5 and the fourth data line DL4, and the sixth sub-pixel P6 of the fourth pixel unit PU4 is electrically connected to the sixth gate line GL6 and the fourth data line DL4. In addition, the arrangement of signal lines e.g. data lines, gate lines, etc., the color of sub-pixels, the arrangement of sub-pixels, the number of sub-pixels, the application of display panel, the variant embodiment or related description are illustrated in the contents of the first embodiment.

Figure 7:
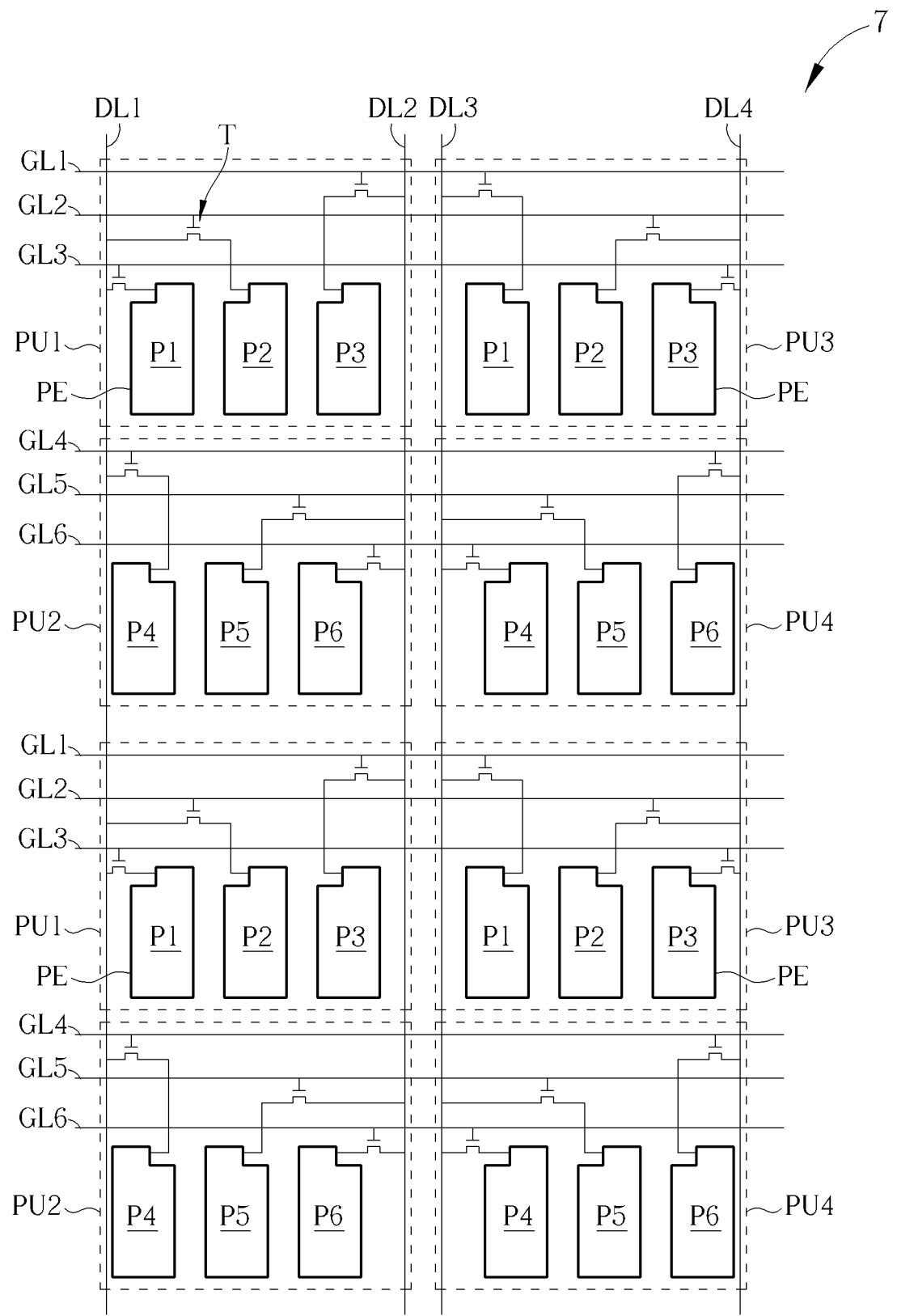
FIG. 7 is a schematic diagram illustrating a display panel according to a third embodiment of this disclosure.

Referring to FIG. 7, FIG. 7 is a schematic diagram illustrating a display panel according to a third embodiment of this disclosure. As shown in FIG. 7, in the display panel 7 of this embodiment, the location of the first pixel unit PU1, the second pixel unit PU2, the third pixel unit PU3 and the fourth pixel unit PU4 is identical to the first embodiment, but the arrangement of the third sub-pixel P3 of the first pixel unit PU1, the fourth sub-pixel P4 of the second pixel unit PU2, the first sub-pixel P1 of the third pixel unit PU3 and the sixth sub-pixel P6 of the fourth pixel unit PU4 is different from the first embodiment. In this embodiment, the third sub-pixel P3 of each first pixel unit PU1 is electrically connected to the first gate line GL1 and the second data line DL2; the fourth sub-pixel P4 of each second pixel unit PU2 is electrically connected to the fourth gate line GL4 and the first data line DL1; the first sub-pixel P1 of each third pixel unit PU3 is electrically connected to the first gate line GL1 and the third data line DL3; and the sixth sub-pixel P6 of each fourth pixel unit PU4 is electrically connected to the fourth gate line GL4 and the fourth data line DL4. In addition, the arrangement of signal lines e.g. data lines, gate lines, etc., the color of sub-pixels, the arrangement of sub-pixels, the number of sub-pixels, the application of display panel, the variant embodiment or related description are illustrated in the contents of the first embodiment.

Figure 8:
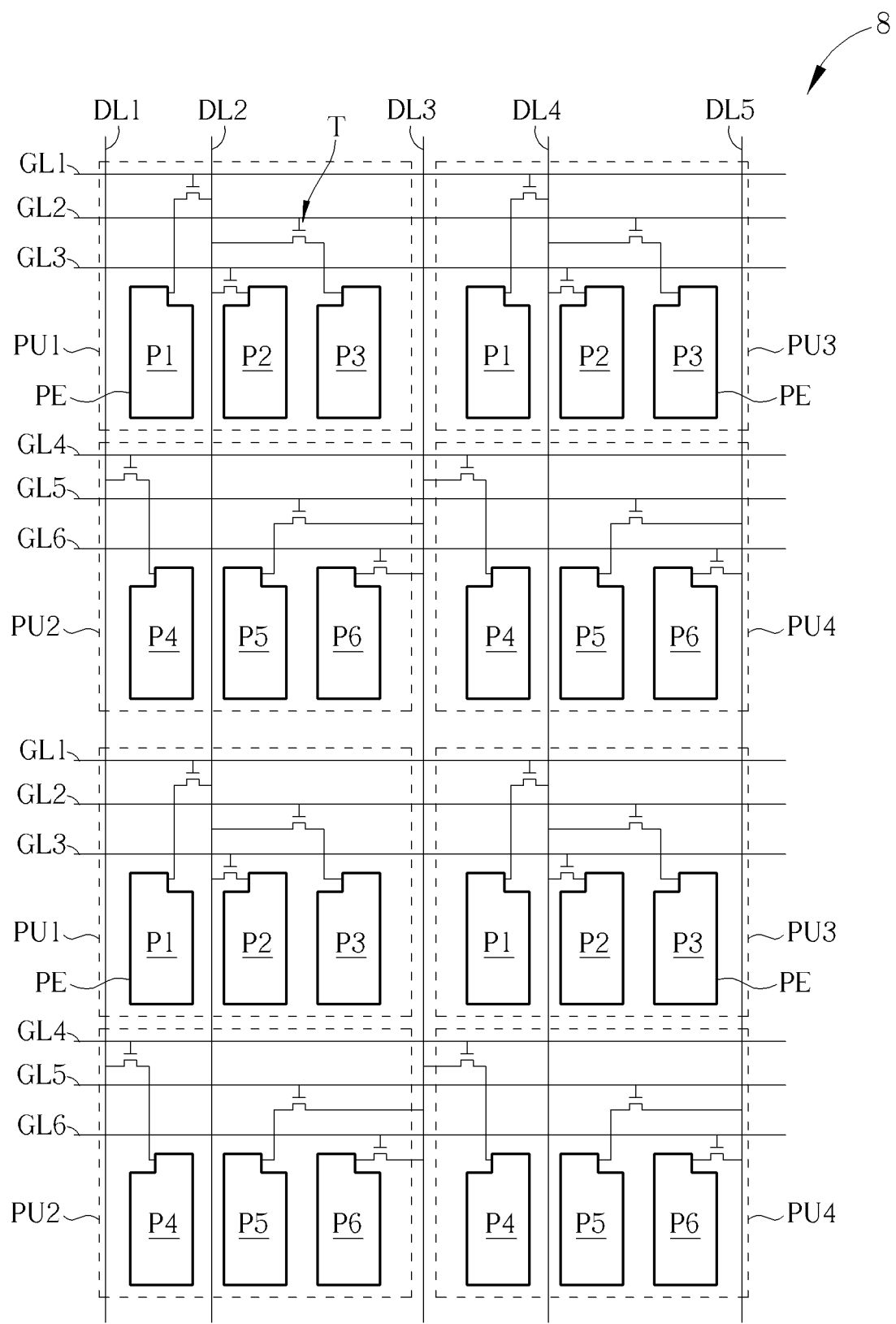
FIG. 8 is a schematic diagram illustrating a display panel according to a fourth embodiment of this disclosure.

Referring to FIG. 8, FIG. 8 is a schematic diagram illustrating a display panel according to a fourth embodiment of this disclosure. As shown in FIG. 8, the display panel 8 of this embodiment includes a plurality of gate lines and a plurality of data lines. The gate lines includes, for example, a first gate line GL1, a second gate line GL2, a third gate line GL3, a fourth gate line GL4, a fifth gate line GL5 and a sixth gate line GL6, substantially extending along a row direction, and substantially arranged sequentially along a column direction. The data lines includes, for example, a first data line DL1, a second data line DL2, a third data line DL3, a fourth data line DL4 and a fifth data line DL5 substantially extending along the column direction, and substantially arranged sequentially along the row direction. The first data line DL1, the second data line DL2 and the third data line DL3 which are arranged sequentially and the first gate line GL1, the second gate line GL2, the third gate line GL3, the fourth gate line GL4, the fifth gate line GL5 and the sixth gate line GL6 which are arranged sequentially are intersected, and therefore constitute the first pixel unit PU1 and the second pixel unit PU2. In other words, the first data line DL1 and the third data line DL3 are the borderlines of the first pixel units PU1 and the second pixel units PU2 disposed in the same column e.g. the first column. The third data line DL3, the fourth data line DL4 and the fifth data line DL5 which are arranged sequentially, and the first gate line GL1, the second gate line GL2, the third gate line GL3, the fourth gate line GL4, the fifth gate line GL5 and the sixth gate line GL6 which are arranged sequentially, and therefore constitute the third pixel unit PU3 and the fourth pixel unit PU4. In other words, the third data line DL3 and the fifth data line DL5 are the borderlines of the third pixel units PU3 and the fourth pixel units PU4 disposed in the same column e.g. the second column. The pixel array includes a first pixel unit PU1, a second pixel unit PU2, a third pixel unit PU3 and a fourth pixel unit PU4. The first pixel unit PU1 and the second pixel unit PU2 are sequentially arranged in an odd column e.g. a first column of the pixel array, the third pixel unit PU3 and the fourth pixel unit PU4 are sequentially arranged in an even column e.g. a second column of the pixel array, the first pixel unit PU1 and the third pixel unit PU3 are sequentially arranged in an odd row e.g. a first row of the pixel array, and the second pixel unit PU2 and the fourth pixel unit PU4 are sequentially arranged in an even row e.g. a second row of the pixel array. The first column and the second column are different columns, and the first row and the second row are different rows. In addition, the fifth data line DL5 also serves as the first data line DL1 of the first pixel units PU1 and the second pixel units PU2 disposed in an adjacent column. In other words, the first column includes first pixel units PU1 and second pixel units PU2, the second column includes third pixel units PU3 and fourth pixel units PU4, and the fifth data line DL5 may serves as the first data line DL1 of the first pixel units PU1 and the second pixel units PU2 of the third column (not shown). The second data line DL2 is disposed between the first sub-pixel P1 and the second sub-pixel P2 of the first pixel unit PU1, and between the fourth sub-pixel P4 and the fifth sub-pixel P5 of the second pixel unit PU2. The fourth data line DL4 is disposed between the first sub-pixel P1 and the second sub-pixel P2 of the third pixel unit PU3, and between the fourth sub-pixel P4 and the fifth sub-pixel P5 of the fourth pixel unit PU4.

The first sub-pixel P1 of each first pixel unit PU1 is electrically connected to a first gate line GL1 and a second data line DL2, the second sub-pixel P2 of each first pixel unit PU1 is electrically connected to a third gate line GL3 and the second data line DL2, and the third sub-pixel P3 of each first pixel unit PU1 is electrically connected to the second gate line GL2 and the second data line DL2. The fourth sub-pixel P4 of each second pixel unit PU2 is electrically connected to the fourth gate line GL4 and the first data line DL1, the fifth sub-pixel P5 of each second pixel unit PU2 is electrically connected to the fifth gate line GL5 and the third data line DL3, and the sixth sub-pixel P6 of each second pixel unit PU2 is electrically connected to the sixth gate line GL 6 and the third data line DL3. The first sub-pixel P1 of each third pixel unit PU3 is electrically connected to the first gate line GL 1 and the fourth data line DL4, the second sub-pixel P2 of each third pixel unit PU3 is electrically connected to the third gate line GL3 and the fourth data line DL4, and the third sub-pixel P3 of each third pixel unit PU3 is electrically connected to the second gate line GL2 and the fourth data line DL4. The fourth sub-pixel P4 of each fourth pixel unit PU4 is electrically connected to the fourth gate line GL4 and the third data line DL3, the fifth sub-pixel P5 of each fourth pixel unit is electrically connected to the fifth gate line GL5 and the fifth data line DL5, and the sixth sub-pixel P6 of each fourth pixel unit PU4 is electrically connected to the sixth gate line GL6 and the fifth data line DL5. In addition, the arrangement of signal lines e.g. data lines, gate lines, etc., the color of sub-pixels, the arrangement of sub-pixels, the number of sub-pixels, the application of display panel, the variant embodiment or related description are illustrated in the contents of the first embodiment.

Figure 9:
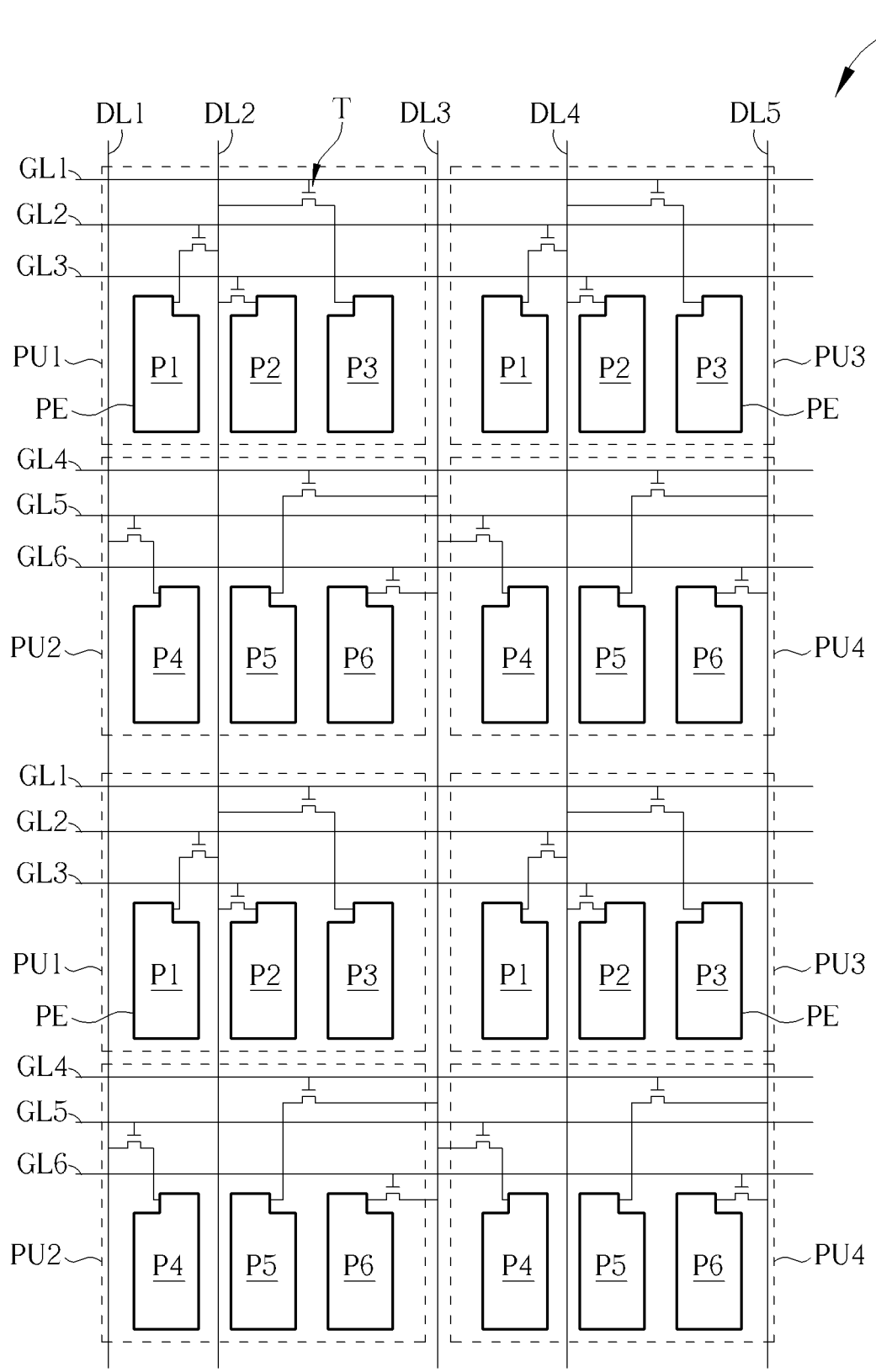
FIG. 9 is a schematic diagram illustrating a display panel according to a fifth embodiment of this disclosure.

Referring to FIG. 9, FIG. 9 is a schematic diagram illustrating a display panel according to a fifth embodiment of this disclosure. As shown in FIG. 9, in the display panel 9 of this embodiment, the arrangement of gate lines and data lines is identical to the fourth embodiment, but the arrangement of the first pixel unit PU1, the second pixel unit PU2, the third pixel unit PU3 and the fourth pixel unit PU4 is different from the fourth embodiment. In this embodiment, the first sub-pixel P1 of each first pixel unit PU1 is electrically connected to the second gate line GL2 and the second data line DL2, the second sub-pixel P2 of each first pixel unit PU1 is electrically connected to the third gate line GL3 and the second data line DL2, and the third sub-pixel P3 of each first pixel unit PU1 is electrically connected to the first gate line GL1 and the second data line DL2. The fourth sub-pixel P4 of each second pixel unit PU2 is electrically connected to the fifth gate line GL5 and the first data line DL1, the fifth sub-pixel P5 of each second pixel unit PU2 is electrically connected to the fourth gate line GL4 and the third data line DL3, and the sixth sub-pixel P6 of each second pixel unit PU2 is electrically connected to the sixth gate line GL6 and the third data line DL3. The first sub-pixel P1 of each third pixel unit PU3 is electrically connected to the second gate line GL2 and the fourth data line DL4, the second sub-pixel P2 of each third pixel unit PU3 is electrically connected to the third gate line GL3 and the fourth data line DL4, and the third sub-pixel P3 of each third pixel unit PU3 is electrically connected to the first gate line GL1 and the fourth data line DL4. The fourth sub-pixel P4 of each fourth pixel unit PU4 is electrically connected to the fifth gate line GL5 and the third data line DL3, the fifth sub-pixel P5 of each fourth pixel unit PU4 is electrically connected to the fourth gate line GL4 and the fifth data line DL5, and the sixth sub-pixel P6 of each fourth pixel unit PU4 is electrically connected to the sixth gate line GL6 and the fifth data line DL5. In addition, the arrangement of signal lines e.g. data lines, gate lines, etc., the color of sub-pixels, the arrangement of sub-pixels, the number of sub-pixels, the application of display panel, the variant embodiment or related description are illustrated in the contents of the first embodiment.

The display panels disclosed in the second, third, fourth and fifth embodiments can be modified as the variant embodiment of FIG. 3, which divides the pixel electrode into two parts, and charges of one of the parts of the pixel electrode is shared by a charge sharing line so that multiple alignment domain effect can be fulfilled and color washout problem can be solved. The mechanism of charging sharing, the common line and the storage capacitor are described in FIG. 3 and related texts. In addition, the display panel discloses in any of the embodiments can be driven by either a precharge driving approach as described in FIG. 5 and related texts or a non-precharge driving approach as described in FIG. 4 and related texts.

In conclusion, the pixel arrangement of the display panel of this disclosure uses fewer data lines, and thus fabrication cost and power consumption can be reduced. Also, since fewer source driving chips are required, the area for accommodating connection wirings and source driving chips can be reduced, which makes it possible to implement slim border design. In addition, the display panel can support charge sharing driving approach, which can therefore realize multiple alignment domain effect and resolve color washout problem. Furthermore, the display panel of this disclosure can be driven by a precharge driving approach.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display panel, comprising:
a first pixel unit and a second pixel unit, sequentially arranged in a first column;
wherein
the first pixel unit at least comprises a first sub-pixel, a second sub-pixel and a third sub-pixel configured to display different colors, respectively, the first sub-pixel of the first pixel unit is electrically connected to a third gate line and a first data line, the second sub-pixel of the first pixel unit is electrically connected to a second gate line and the first data line, and the third sub-pixel of the first pixel unit is electrically connected to a first gate line, and
the second pixel unit at least comprises a fourth sub-pixel, a fifth sub-pixel and a sixth sub-pixel configured to display different colors, respectively, the fourth sub-pixel of the second pixel unit is electrically connected to a fourth gate line, the fifth sub-pixel of the second pixel unit is electrically connected to a fifth gate line and a second data line, and the sixth sub-pixel of the second pixel unit is electrically connected to a sixth gate line and the second data line, wherein the first data line and the second data line, which are arranged sequentially, intersect the first gate line, the second gate line, the third gate line, the fourth gate line, the fifth gate line and the sixth gate line, which are arranged sequentially, thereby constituting the first pixel unit and the second pixel unit.

2. The display panel of claim 1, wherein each of the first sub-pixel, the second sub-pixel, the third sub-pixel, the fourth sub-pixel, the fifth sub-pixel and the sixth sub-pixel comprises a first pixel electrode and a second pixel electrode.

3. The display panel of claim 2, further comprising a first common line and a second common line, wherein each of the first pixel electrodes of the first sub-pixel, the second sub-pixel and the third sub-pixel forms a storage capacitor with the first common line, and each of the first pixel electrodes of the fourth sub-pixel, the fifth sub-pixel and the sixth sub-pixel forms a storage capacitor with the second common line.

4. The display panel of claim 2, further comprising a first charge sharing line and a second charge sharing line, wherein the first charge sharing line is configured to perform charge sharing on the second pixel electrodes of the first sub-pixel, the second sub-pixel and the third sub-pixel, and the second charge sharing line is configured to perform charge sharing on the second pixel electrodes of the fourth sub-pixel, the fifth sub-pixel and the sixth sub-pixel.

5. The display panel of claim 1, further comprising a third data line and a fourth data line, wherein the third data line is most adjacent to the second data line, and the first data line and the fourth data line are distant from the third data line and the second data line.

6. The display panel of claim 5, further comprising a third pixel unit and a fourth pixel unit sequentially arranged in a second column, wherein the first column and the second column are different columns, the third pixel unit at least comprises the first sub-pixel, the second sub-pixel and the third sub-pixel configured to display different colors, respectively, and the fourth pixel unit at least comprises the fourth sub-pixel, the fifth sub-pixel and the sixth sub-pixel configured to display different colors, respectively.

7. The display panel of claim 6, wherein the first sub-pixels of the first pixel unit and the third pixel unit and the fourth sub-pixels of the second pixel unit and the fourth pixel unit display the same color, the second sub-pixels of the first pixel unit and the third pixel unit and the fifth sub-pixels of the second pixel unit and the fourth pixel unit display the same color, and the third sub-pixels of the first pixel unit and the third pixel unit and the sixth sub-pixels of the second pixel unit and the fourth pixel unit display the same color.

8. The display panel of claim 6, wherein the third sub-pixel of the first pixel unit is electrically connected to the second data line, and the fourth sub-pixel of the second pixel unit is electrically connected to the first data line.

9. The display panel of claim 8, wherein
the first sub-pixel of the third pixel unit is electrically connected to the first gate line and the third data line, the second sub-pixel of the third pixel unit is electrically connected to the second gate line and the fourth data line, and the third sub-pixel of the third pixel unit is electrically connected to the third gate line and the fourth data line; and
the fourth sub-pixel of the fourth pixel unit is electrically connected to the sixth gate line and the third data line, the fifth sub-pixel of the fourth pixel unit is electrically connected to the fifth gate line and the third data line, and the sixth sub-pixel of the fourth pixel unit is electrically connected to a fourth gate line and the fourth data line,
wherein the third data line and the fourth data line, which are arranged sequentially, intersect the first gate line, the second gate line, the third gate line, the fourth gate line, the fifth gate line and the sixth gate line, which are arranged sequentially, thereby constituting the third pixel unit and the fourth pixel unit.

10. The display panel of claim 6, wherein the third sub-pixel of the first pixel unit is electrically connected to the first data line, and the fourth sub-pixel of the second pixel unit is electrically connected to the second data line.

11. The display panel of claim 10, wherein
the first sub-pixel of the third pixel unit is electrically connected to the first gate line and the fourth data line, the second sub-pixel of the third pixel unit is electrically connected to the second gate line and the fourth data line, and the third sub-pixel of the third pixel unit is electrically connected to the third gate line and the fourth data line; and
the fourth sub-pixel of the fourth pixel unit is electrically connected to the sixth gate line and the third data line, the fifth sub-pixel of the fourth pixel unit is electrically connected to the fifth gate line and the third data line, and the sixth sub-pixel of the fourth pixel unit is electrically connected to the fourth gate line and the third data line,
wherein the third data line and the fourth data line, which are arranged sequentially, intersect the first gate line, the second gate line, the third gate line, the fourth gate line, the fifth gate line and the sixth gate line, which are arranged sequentially, thereby constituting the third pixel unit and the fourth pixel unit.

12. The display panel of claim 10, wherein
the first sub-pixel of the third pixel unit is electrically connected to the third gate line and the third data line, the second sub-pixel of the third pixel unit is electrically connected to the second gate line and the third data line, and the third sub-pixel of the third pixel unit is electrically connected to the first gate line and the third data line; and
the fourth sub-pixel of the fourth pixel unit is electrically connected to the fourth gate line and the fourth data line, the fifth sub-pixel of the fourth pixel unit is electrically connected to the fifth gate line and the fourth data line, and the sixth sub-pixel of the fourth pixel unit is electrically connected to the sixth gate line and the fourth data line,
wherein the third data line and the fourth data line, which are arranged sequentially, intersect the first gate line, the second gate line, the third gate line, the fourth gate line, the fifth gate line and the sixth gate line, which are arranged sequentially, thereby constituting the third pixel unit and the fourth pixel unit.

* * * * *